(12) United States Patent
Chi

(10) Patent No.: US 7,688,142 B2
(45) Date of Patent: Mar. 30, 2010

(54) HIGH PERFORMANCE VARIABLE GAIN AMPLIFIER, METHOD OF USE AND DESIGN STRUCTURE

(75) Inventor: Howard H. Chi, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 85 days.

(21) Appl. No.: 11/949,064

(22) Filed: Dec. 3, 2007

(65) Prior Publication Data

US 2009/0140809 A1   Jun. 4, 2009

(51) Int. Cl.
*H03F 3/45* (2006.01)

(52) U.S. Cl. ...................................... 330/254; 330/252

(58) Field of Classification Search ......... 330/252–254, 330/283; 327/359, 563
See application file for complete search history.

(56) References Cited

U.S. PATENT DOCUMENTS

| | | | |
|---|---|---|---|
| 6,331,803 B1 | 12/2001 | Zheng et al. | 330/279 |
| 6,353,364 B1 | 3/2002 | Klemmer | 330/254 |
| 6,552,612 B1 * | 4/2003 | Wilson | 330/254 |
| 7,417,506 B2 * | 8/2008 | Klein et al. | 330/254 |

* cited by examiner

*Primary Examiner*—Khanh V Nguyen
(74) *Attorney, Agent, or Firm*—Riyon Harding; Greenblum & Bernstein P.L.C.

(57) ABSTRACT

A circuit of high performance variable gain amplifier, method of use and design structure on which the subject circuit resides is provided. The circuit comprises a plurality of differential stages having a common input, and output, a common control level input CM and respective individual control level inputs $C_x$. The circuit also includes a fixed stage that always is biased to an "on" state from the common input.

22 Claims, 6 Drawing Sheets

100 US 7,688,142 B2 1

HIGH PERFORMANCE VARIABLE GAIN AMPLIFIER, METHOD OF USE AND DESIGN STRUCTURE

GOVERNMENT LICENSING RIGHTS

The U.S. Government has a paid-up license in this invention and the right in limited circumstances to require the patent owner to license others on reasonable terms as provided for by the terms of contract No. 002753 awarded by the Maryland Procurement Office under government program "JTRS Spiral2 CoreRadio1".

FIELD OF THE INVENTION

The invention relates to a circuit and method of use and, more particularly, to a high performance variable gain amplifier, method of use and design structure on which the subject circuit resides.

BACKGROUND DESCRIPTION

A variable gain amplifier is an electronic amplifier that varies its gain depending on a control voltage (often abbreviated CV). The variable gain amplifier can be fabricated as a CMOS or BiCMOS circuit and has many applications, including handling dynamic signal level in transmitter and receiver of a radio device for radio-freq and microwave applications. For example, variable gain amplifiers have been widely used as an AGC circuit (automatic gain control) to control gains in order to obtain a fixed output signal level for a fluctuating modulated input signal level. The reliability of demodulation is increased by applying a fixed signal level to the demodulator at the later stage of processing, and high signal-to-noise ratio (S/N ratio), i.e. small signal distortion, also increases the reliability of demodulation.

More particularly, when an input signal level to the variable gain amplifier is small, an AGC circuit having low noise characteristics is required at receiver to obtain the high signal-to-noise ratio described above. It is demanding at radio that a high linearity (low inter-modulation), which often characterized as IP3, can be obtained across input signal range.

In general, in order to have high linearity (low inter-modulation), an amplifier having a negative feedback structure is used to increase input level linearity. However, in known circuits, there is poor input impedance matching at differential AGC (automatic gain control) levels due to de-generation, as well as low dynamic range and no high IP3 at high gain.

Accordingly, there exists a need in the art to overcome the deficiencies and limitations described hereinabove.

SUMMARY OF THE INVENTION

In a first aspect of the invention, a circuit comprises a plurality of differential stages having a common input and output, a common control level input CM and respective individual control level inputs $C_x$. The circuit also includes a fixed stage that always is biased to an "on" state from the common input.

In another aspect of the invention, a method comprises: setting cross points; choosing a gain and maximizing linearity by setting degeneration resistor values and DC bias currents for each stage, and load resistors RL; and cascading multi-stage cores.

In yet another aspect of the invention, a design structure is embodied in a machine readable medium for designing, manufacturing, or testing a design. The design structure comprises: a plurality of differential stages having a common input, a common control level input CM and a respective individual control level input $C_x$; and a fixed stage that always is biased to an "on" state from the common input.

BRIEF DESCRIPTION OF THE DRAWINGS

The present invention is described in the detailed description which follows, in reference to the noted plurality of drawings by way of non-limiting examples of exemplary embodiments of the present invention, in which.

DETAILED DESCRIPTION OF EMBODIMENTS OF THE INVENTION

The invention relates to a circuit and method of use and, more particularly, to a high performance variable gain amplifier, method of use and design structure on which the circuit resides. In implementation, the high performance variable gain amplifier is a multi-stage variable gain amplifier (VGA) circuit, where each stage is connected to inputs, to outputs and to a pair of analog control voltages. The bias of each stage is optimized for linearity and transconductance at its cross point. The multi-stage architecture also provides a wide dynamic range with good linearity and the optimized transconductance of each stage minimizes the noise figure. Also, because the circuit has a constant bias, the input impedance is fixed and impedance matching is straightforward.

Advantageously, the circuit is a high linear and low noise figure circuit at a dynamic range much beyond 10 dB and more particularly at about 33 dB. In embodiments, the circuit exhibits approximately 5 dB NF (noise figure) at high gain. (NF is a measure of degradation of signal to noise ratio caused by components in the RF signal chain.) The circuit also has an approximate 10 dB power gain and requires less than about 10 mA at about 3.3V supply. The circuit also exhibits a high input IP3 at high gain. There is also improved impedance matching at the input and output.

Figure 1:
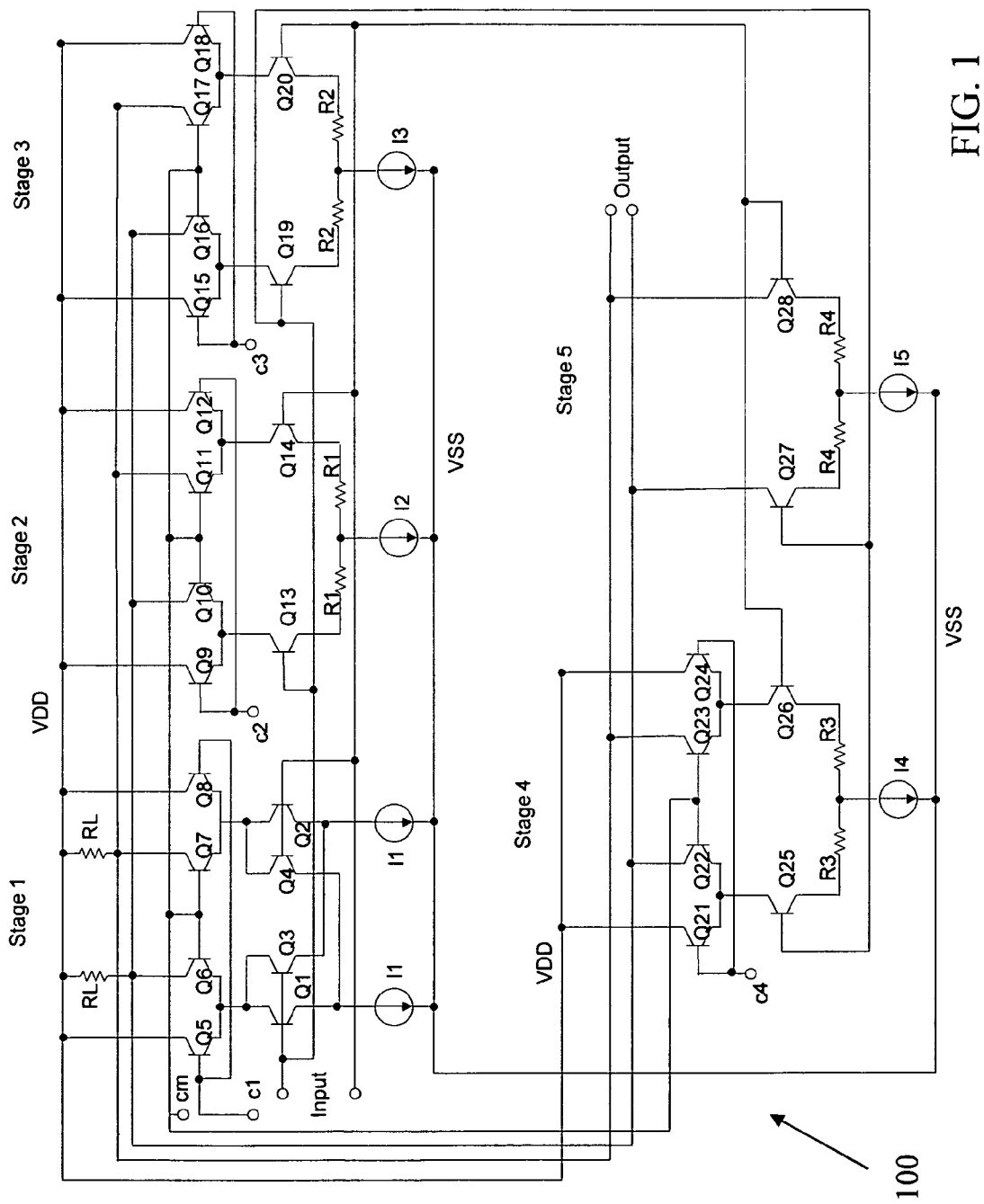
FIG. 1 shows a high performance variable gain amplifier (circuit) in accordance with an embodiment of the invention.

FIG. 1 shows a high performance variable gain amplifier (VGA) circuit in accordance with an aspect of the invention. Generally, the VGA circuit is shown at reference numeral 100. The circuit 100 includes five stages: four dynamic (differential) multi-stages and one fixed stage. Although using four dynamic stages current can be limited to less than about 10 mA for a wide dynamic range at about 33 dB, more than four dynamic stages are also contemplated by the invention (which is dependent on the required total dynamic range). (See, e.g., the discussion of FIG. 5.)

More specifically, FIG. 1 shows the circuit 100 with five stages in parallel: stage 1, stage 2, stage 3, stage 4 and stage 5. Stages 2-5 each have emitter degeneration resistors. In embodiments, the maximum loss of the circuit 100 is provided by stage 5 with two degeneration resistors, R4.

Stages 1-4 have a common analog control level input CM and respective individual analog control level inputs C1, C2, C3 and C4. In embodiments, the input of CM is between about 2.6 volts (low) to about 2.8 volts (high), and the voltage difference "delta" between each control level input C1, C2, C3 and C4 is equal. Also, as discussed herein, stage 5 does not have a control (CM) as it remains on at all times in order to maintain a current in the circuit 100 when the remaining stages are in the "off" state. As such, CM controls stages 1-4 by providing current to:

(i) Stage 1: transistors $Q_6$ and $Q_7$;
(ii) Stage 2: transistors $Q_{10}$ and $Q_{11}$;
(iii) Stage 3: transistors $Q_{16}$ and $Q_{17}$; and
(iv) Stage 4: transistors $Q_{22}$ and $Q_{23}$.

In the configuration of FIG. 1, at stage 1, CM is configured to steer current away from transistors $Q_5$ and $Q_8$. At stage 2, CM is configured to steer current away from transistors $Q_9$ and $Q_{12}$. At stage 3, CM is configured to steer current away from transistors $Q_{15}$ and $Q_{18}$, and, at stage 4, CM is configured to steer current away from transistors $Q_{21}$ and $Q_{24}$. In stage 5, though, the current always remains on, regardless of the current in CM and, as such, there is no current steering in this stage.

Still referring to FIG. 1, at stage 1, C1 provides current to transistors $Q_5$ and $Q_8$ and is configured to steer current away from transistors $Q_6$ and $Q_7$. At stage 2, C2 provides current to transistors $Q_9$ and $Q_{12}$ and is configured to steer current away from transistors $Q_{10}$ and $Q_{11}$. At stage 3, C3 provides current to transistors $Q_{15}$ and $Q_{18}$ and is configured to steer current away from transistors $Q_{16}$ and $Q_{17}$, and, at stage 4, C4 provides current to transistors $Q_{21}$ and $Q_{24}$ and is configured to steer current away from transistors $Q_{22}$ and $Q_{23}$.

As further shown in FIG. 1, the Input provides current to all the stages, in parallel. More specifically, the Input provides current to:

(i) Stage 1: transistors $Q_1$, $Q_2$, $Q_3$ and $Q_4$;
(ii) Stage 2: transistors $Q_{13}$ and $Q_{14}$;
(iii) Stage 3: transistors $Q_{19}$ and $Q_{20}$;
(iv) Stage 4: transistors $Q_{25}$ and $Q_{26}$; and
(v) Stage 5: transistors $Q_{27}$ and $Q_{28}$.

As the input of all stages is connected together, all tail currents are fixed and input is not affected by the control voltages. Therefore, input impedance is very stable and can be matched very well.

In embodiments, the voltage of C4<C3<C2<C1. In this scenario, when the voltage of CM<C4, stages 1-4 are turned "off" and the current is steered away from, respectively, transistors $Q_6$, $Q_7$ and $Q_{10}$, $Q_{11}$ and $Q_{16}$, $Q_{17}$ and $Q_{22}$, $Q_{23}$. However, as shown in TABLE 1, as the voltage of CM is incremented higher, stages 1-4 can be incrementally and gradually turned "on" (as the current is steered away from, e.g., transistors $Q_5$ and $Q_8$, $Q_9$, and $Q_{12}$, $Q_{15}$ and $Q_{18}$, $Q_{21}$ and $Q_{24}$, respectively).

For example, when the voltage of CM>C4 (but less than C1-C3), stage 4 is in the "on" state and stages 1-3 remain in the "off" state. As the voltage of CM is incremented to CM>C3 (but less than C1 and C2), stages 3 and 4 are in the "on" stage and stages 1 and 2 remain in the "off" state. Similarly, when the voltage of CM>C2 (but less than C1), stages 2-4 are in the "on" state and stage 1 remains in the "off" state. Lastly, when the voltage of CM>C1, stages 1-4 are in the "on" state".

TABLE 1

|  | Stage 1 | Stage 2 | Stage 3 | Stage 4 |
|---|---|---|---|---|
| CM < C4 | OFF | OFF | OFF | OFF |
| C3 > CM > C4 | OFF | OFF | OFF | ON |

TABLE 1-continued

|  | Stage 1 | Stage 2 | Stage 3 | Stage 4 |
|---|---|---|---|---|
| C2 > CM > C3 | OFF | OFF | ON | ON |
| C1 > CM > C2 | OFF | ON | ON | ON |
| CM > C1 | ON | ON | ON | ON |

Figure 2:
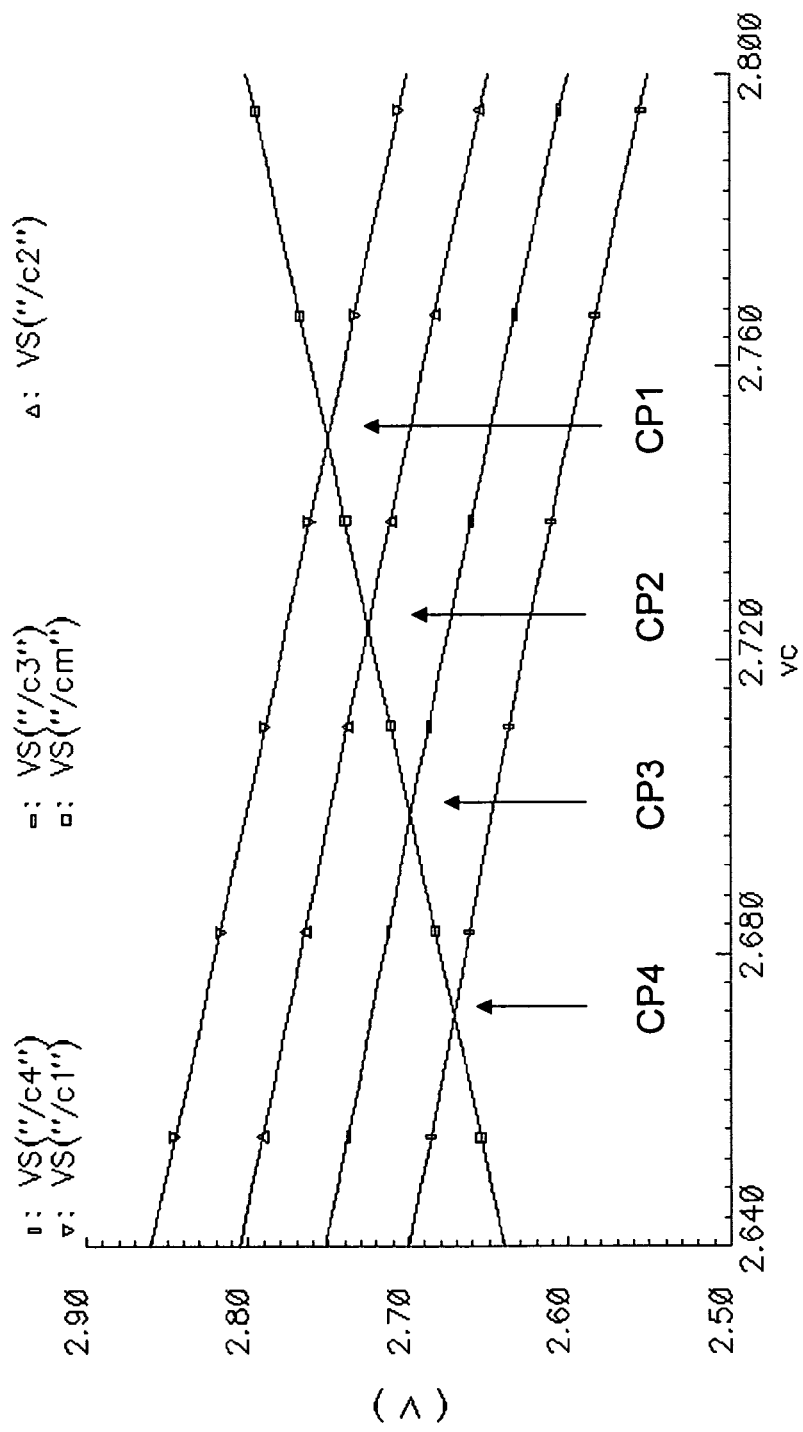
FIG. 2 shows illustrative control levels of the circuit of FIG. 1.

FIG. 2 shows illustrative control levels of the circuit 100 of FIG. 1. As should be understood by those of skill in the art, the analog control voltage inputs CM and C1-C4 establish four cross points, CP1, CP2, CP3 and CP4, within two extreme states. As shown in TABLE 1 and illustratively in FIG. 2, each stage is incrementally turned to the "on" state as the CM voltage increases above the respective cross points e.g., CP4, CP3, CP2 and CP1, for C4, C3, C2 and C1, respectively.

Figure 3:
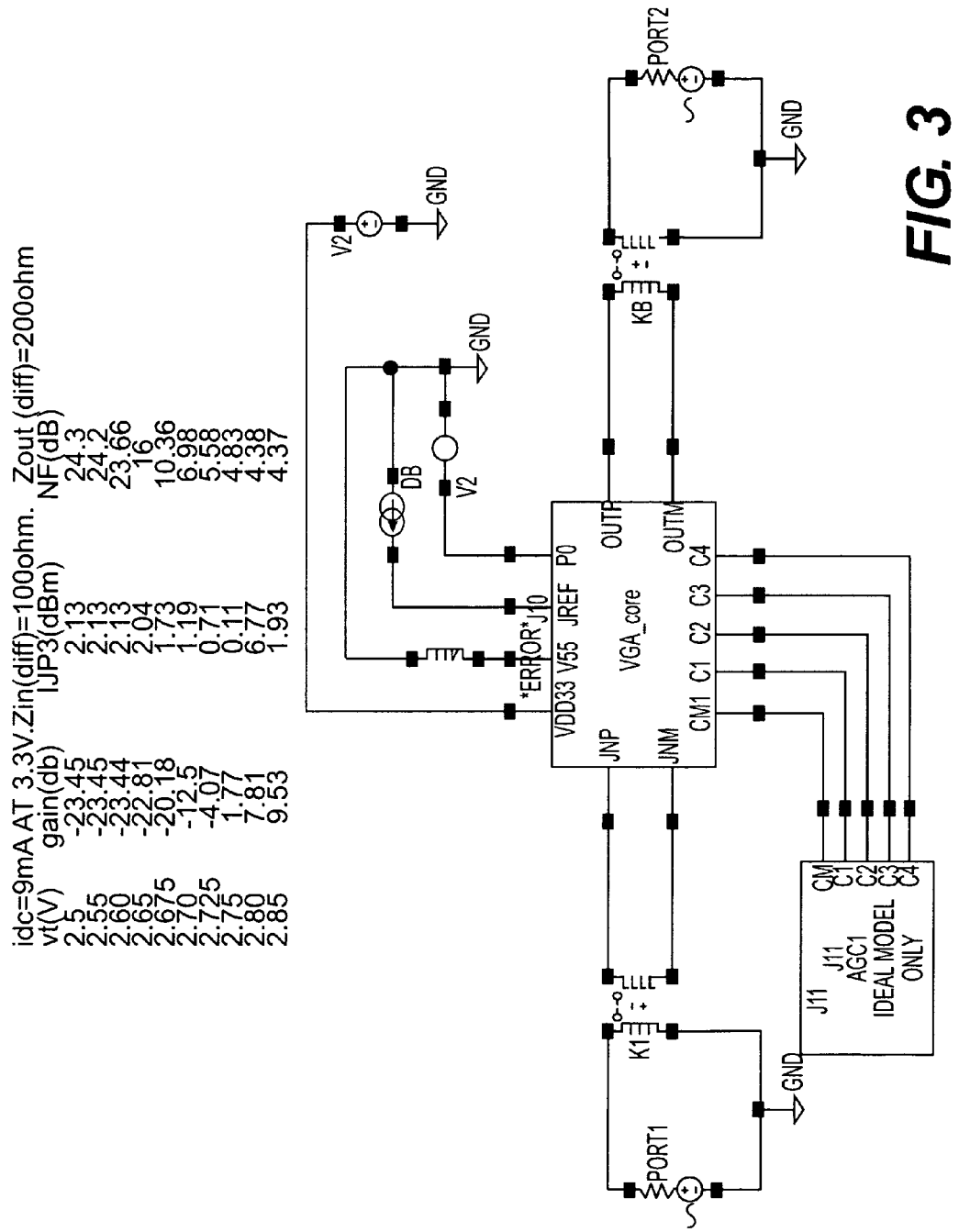
FIG. 3 shows simulation results of the circuit of FIG. 1.

FIG. 3 shows a simulation result of the circuit 100 of FIG. 1. As shown in FIG. 3, the simulated noise figure of circuit 100 is low (below 5 dB), with very high linearity at high gain. More specifically, at a Vt of 2.85, the noise level is at about 4.37 dB. Also, as shown by this simulation, the noise figures remain low at a high CM voltage, e.g., when stages 1-4 are turned "on", and the noise figures gradually become constant, as the CM voltage becomes higher (since all of the stages are turned to the "on" state). Also, low noise figure is demonstrated because low shot noise contribution and good input impedance match to the reference, and the overall circuit behaves as one super stage with broad transconductance over 33 dB dynamic range for high linearity, good gain and low noise figure.

As further shown by the simulation of FIG. 3, the stages 1-4 can be optimized at respective cross points, with the dynamic range of the circuit 100 being very wide. Thus, in comparison to known circuits, the circuit of the present invention has a high input IP3 at high gain, and with optimized stages, broadens transconductance (Gm) throughout a wide dynamic range. Accordingly, in implementation, each stage can be optimized at low current to contribute high IP3 at high gain, and input impedance (unlike known circuits) is very stable because VGA input bias current is fixed.

Figure 4:
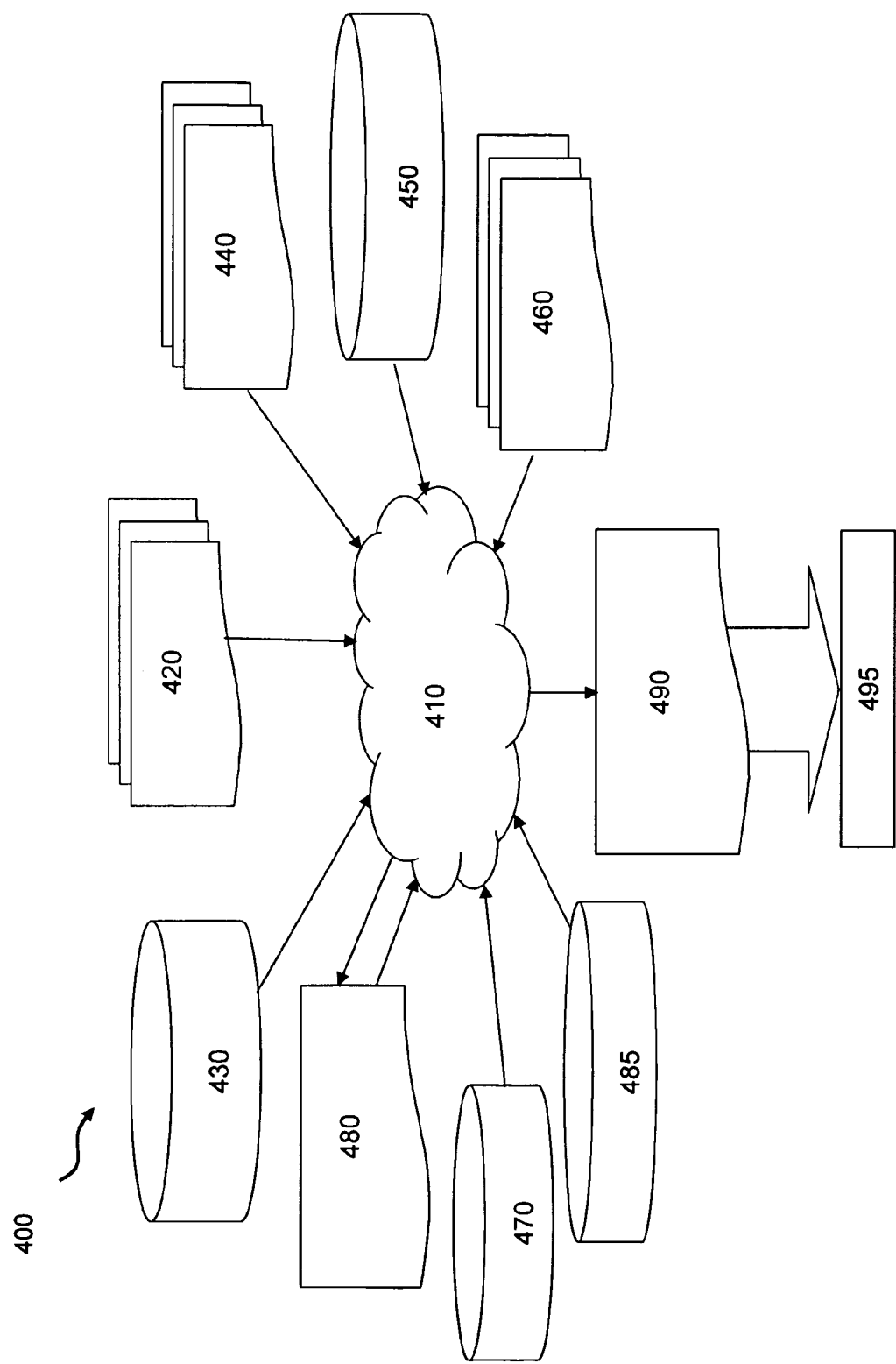
FIG. 4 is a flow diagram of a design process used in semiconductor design, manufacturing, and/or test.

FIG. 4 shows a block diagram of an exemplary design flow 400 used for example, in semiconductor design, manufacturing, and/or test. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises an embodiment of the invention as shown in FIG. 1, for example, in the form of schematics or HDL, a hardware-description language (e.g., Verilog, VHDL, C, etc.). Design structure 420 may be contained on one or more machine readable medium. For example, design structure 420 may be a text file or a graphical representation of an embodiment of the invention as shown in FIG. 1, for example. Design process 410 preferably synthesizes (or translates) an embodiment of the invention as shown in FIG. 1, for example into a netlist 480, where netlist 480 is, for example, a list of wires, transistors, logic gates, control circuits, I/O, models, etc. that describes the connections to other elements and circuits in an integrated circuit design and recorded on at least one of machine readable medium. This may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 90 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the invention. The design structure of the invention is not limited to any specific design flow.

Design process 410 preferably translates an embodiment of the invention as shown in FIG. 1, for example, along with any additional integrated circuit design or data (if applicable), into a second design structure 490. Design structure 490 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in FIG. 1, for example. Design structure 490 may then proceed to a stage 495 where, for example, design structure 490: proceeds to tape-out, is released to manufacturing, is released to a mask house, is sent to another design house, is sent back to the customer, etc.

Figure 5:
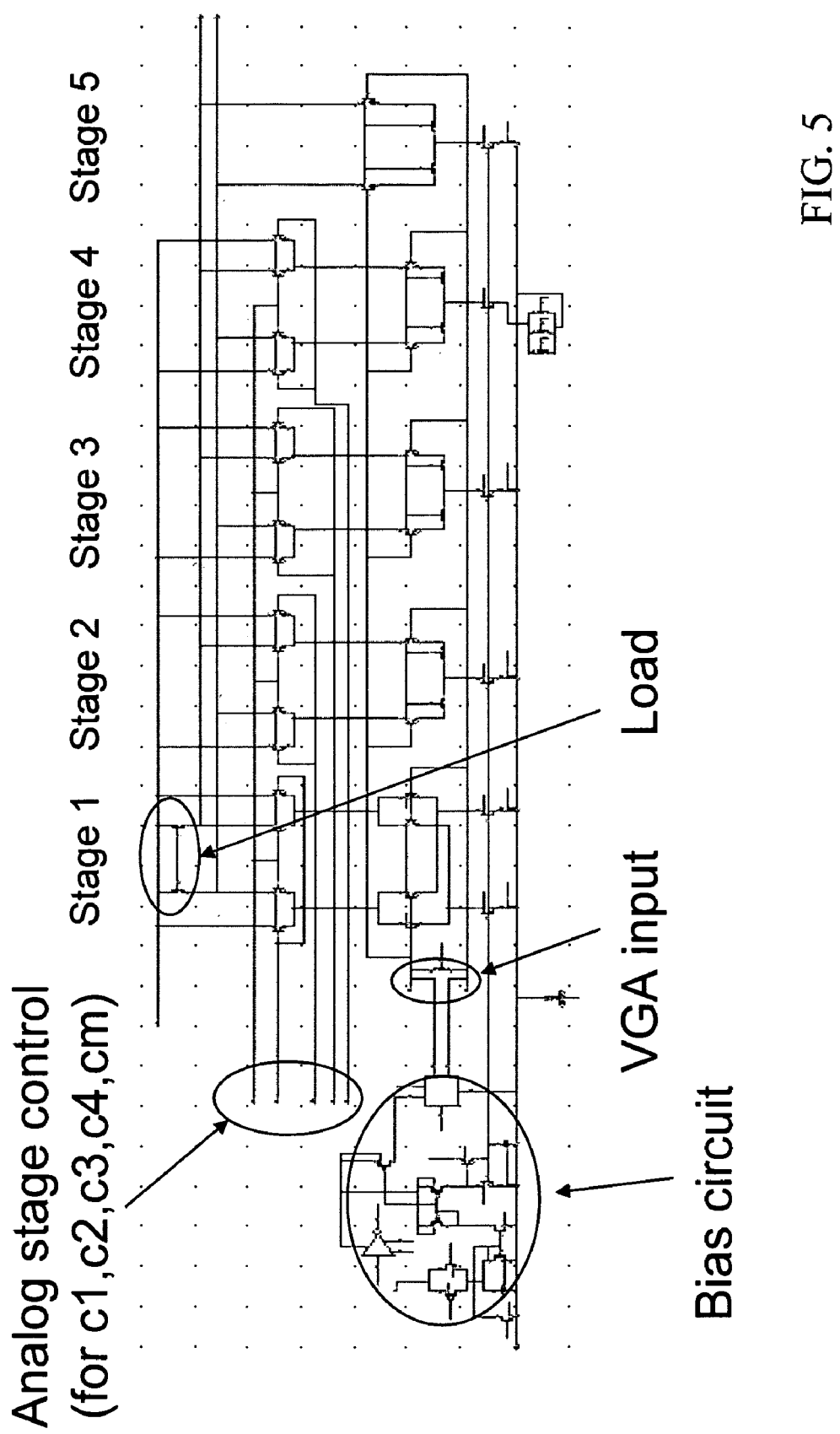
FIG. 5 is a design structure according to an aspect of the invention.

FIG. 5 is a design structure according to an aspect of the invention. Advantageously, in the design structure, the circuit is a high linear and low noise figure circuit at dynamic range much beyond 10 dB. When a common control voltage is swept from low to high (gradually passing each stage dc control level) within the dc control range, minimum gain to maximum gain is expected, which is a result of from "off" to "on" from switching stages 4-1 due to current steering behavior. In the design structure (and circuit), the dynamic range (gain range) corresponds to a unique dc control range, at which each particular voltage level corresponds to a gain point. And, with N switching stages optimized and N dc levels within the dc control range, a broaden transconductance resulting from N stages provides high linear IP3 performance at the dynamic range planned and designed.

Also, since input and output impedance are not dependent on current switching due to gain variation, the designer can have the freedom to choose the number of stages within the circuit. To this end, factors that may influence the design's choice can include, but without limitation, total current available and/or linearity at a particular gain point (or within a gain range). Fore example, it is possible to implement two stages with a last stage having no current switching when the dynamic range is small. Similarly, in the design structure, additional stages can be gradually implemented as the dynamic range increases.

To decide on a design, a sweep of linearity simulation in IP3 over the entire range against specification should tell the designer where there is a need for further circuit optimization from existing stages and/or by adding stage(s). For example, when all switching stages are in the "on" state, at maximum gain, all stages are contributing to IP3 and when only some stages are in the "on" state, only those stages contribute to IP3 performance. Therefore, optimizing IP3 can be made by adding additional stage(s) at a particular gain point until the entire dynamic range is optimized.

Figure 6:
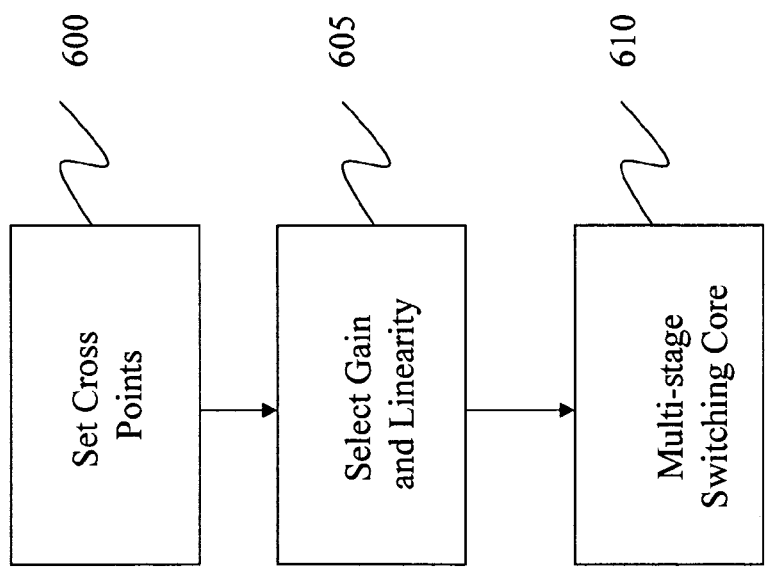
FIG. 6 shows a flow chart implementing processes according to the invention.

FIG. 6 shows a flow chart implementing processes according to the invention. At step 600, cross points are set to optimize the circuit, which can be accomplished as described above. At step 605, a gain and maximization of linearity is selected by setting degeneration resistor values and the DC bias currents for each stage, and load resistors RL. At step 610, the multi-stage switching core are connected in common input and output configuration. In embodiments, the cross points are set at four cross points, and the setting of the cross points is provided at voltage intersections of the common control level input CM and respective individual control level inputs $C_x$ of the plurality of differential stages.

While the invention has been described in terms of exemplary embodiments, those skilled in the art will recognize that the invention can be practiced with modifications and in the spirit and scope of the appended claims.

It is claimed:

1. A circuit, comprising:
a plurality of differential stages having a common input, a common control level input CM and respective individual control level inputs $C_x$; and
a fixed stage that always is biased to an "on" state from the common input.

2. The circuit of claim 1, wherein the common control level input CM and the respective individual control level inputs $C_x$ establish cross points.

3. The circuit of claim 1, wherein the plurality of differential stages have fixed tail currents.

4. The circuit of claim 1, wherein outputs of the plurality of differential stages are in parallel.

5. The circuit of claim 1, wherein inputs to each of the plurality of differential stages from the common input are in parallel.

6. The circuit of claim 1, wherein the common control level input CM is configured to steer current away from transistors under control of the respective individual control level inputs $C_x$ as a voltage of the common control level input CM incrementally increases above a voltage for each of the individual control level inputs $C_x$.

7. The circuit of claim 1 is a high linear and low noise figure circuit having a dynamic range beyond 10 dB.

8. The circuit of claim 7, wherein the dynamic range is about 33 dB.

9. The circuit of claim 1 is a high linear and low noise figure circuit that exhibits approximately 5 dB NF (noise figure) at high gain.

10. The circuit of claim 1 is a high linear and low noise figure circuit with about a 10 dB power gain requiring less than 10 mA at about 3.3V supply.

11. The circuit of claim 1, wherein the plurality of differential stages is four stages.

12. The circuit of claim 1, wherein a voltage of the common control level input CM is between about 2.6 volts (low) to about 2.8 volts (high).

13. The circuit of claim 1, wherein the respective individual control level inputs $C_x$ have an equal voltage difference "delta" therebetween.

14. A method, comprising:
setting cross points;
choosing a gain and maximizing linearity by setting degeneration resistor values and DC bias currents for each stage, and load resistors RL; and
creating multi-stage switching cores.

15. The method of claim 14, further comprising selecting a number of stages of the multi-stage switching cores by determining at least one of total current available and linearity at a particular gain point or within a gain range.

16. The method of claim 14, wherein the setting cross points is provided at voltage intersections of common control level input CM and respective individual control level inputs $C_x$ of a plurality of differential stages.

17. The method of claim 14, wherein the setting cross points is provided at voltage intersections of voltage inputs.

18. The method of claim 14, further comprising incrementally and gradually turning on each of a plurality of stages as a common voltage increases above respective cross points of a set of cross points.

19. The method of claim 14, further comprising biasing a fixed stage always in an on state from a common input.

20. A design structure stored in a machine readable medium for designing, manufacturing, or testing an integrated circuit, the design structure comprising:

a plurality of differential stages having a common input and output, a common control level input CM and a respective individual control level input $C_x$; and a fixed stage that always is biased to an "on" state from the common input.

21. The design structure of claim 20, wherein the design structure comprises a netlist.

22. The design structure of claim 20, wherein the design structure resides on storage medium as a data format used for the exchange of layout data of integrated circuits.

* * * * *